(12) United States Patent
Kim

(10) Patent No.: US 8,829,553 B2
(45) Date of Patent: Sep. 9, 2014

(54) LIGHT EMITTING PACKAGE AND METHODS OF FABRICATING THE SAME

(75) Inventor: Yu-Sik Kim, Yangcheon-gu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 158 days.

(21) Appl. No.: 12/805,085

(22) Filed: Jul. 12, 2010

(65) Prior Publication Data

US 2011/0012153 A1 Jan. 20, 2011

(30) Foreign Application Priority Data

Jul. 20, 2009 (KR) .................. 10-2009-0065958

(51) Int. Cl.
*H01L 33/00* (2010.01)

(52) U.S. Cl.
USPC .................................. 257/99; 257/E33.058

(58) Field of Classification Search
USPC ......... 257/98, 99, E33.056, E33.058; 438/26, 438/27
See application file for complete search history.

(56) References Cited

U.S. PATENT DOCUMENTS

| | | | | |
|---|---|---|---|---|
| 7,023,019 B2* | 4/2006 | Maeda et al. | ................... | 257/89 |
| 7,329,942 B2 | 2/2008 | Tsou et al. | | |
| 2005/0269695 A1* | 12/2005 | Brogle et al. | ................ | 257/731 |
| 2006/0027826 A1* | 2/2006 | Goodrich | ...................... | 257/99 |
| 2006/0214178 A1* | 9/2006 | Choi et al. | ...................... | 257/99 |
| 2008/0149962 A1* | 6/2008 | Kim et al. | ....................... | 257/99 |
| 2008/0290353 A1* | 11/2008 | Medendorp et al. | ............ | 257/89 |
| 2009/0026472 A1* | 1/2009 | Yasuda et al. | .................. | 257/98 |
| 2009/0278153 A1* | 11/2009 | Cho | ................................. | 257/98 |
| 2010/0148210 A1* | 6/2010 | Huang et al. | .................... | 257/99 |

FOREIGN PATENT DOCUMENTS

| | | |
|---|---|---|
| KR | 10-0587016 B1 | 5/2006 |
| KR | 10-0845856 A | 6/2008 |

OTHER PUBLICATIONS

Brogle et al., Drawings as Filed in U.S. Appl. No. 10/862,710, publicly available on Dec. 8, 2005 when U.S. Pub. 2005/0269695 was published.*

* cited by examiner

*Primary Examiner* — Julio Maldonado
*Assistant Examiner* — Daniel Shook
(74) *Attorney, Agent, or Firm* — Harness, Dickey & Pierce, P.L.C.

(57) ABSTRACT

Example embodiments are directed to a light emitting package having a structure that prevents variance in a depth of a cavity in which a chip is mounted and a method of fabricating the same. A light emitting package includes a package body including a first body including the cavity and a second body bonded to the first body. The cavity penetrates the first body. A first electrode and a second electrode separate from each other are on the package body. A first dielectric layer is between the package body and the first electrode and between the package body and the second electrode. A light emitting element is placed in the cavity and electrically connected to the first electrode and the second electrode. A method of fabricating the light emitting package includes forming the first body and the second body bonded to the first body through a dielectric layer, forming the cavity in the first body and forming the light emitting element in the cavity.

11 Claims, 14 Drawing Sheets

LIGHT EMITTING PACKAGE AND METHODS OF FABRICATING THE SAME

CROSS REFERENCE TO RELATED APPLICATIONS

This application claims priority under 35 U.S.C. §119 to Korean Patent Application No. 10-2009-0065958 filed on Jul. 20, 2009, in the Korean Intellectual Property Office, the disclosure of which is incorporated herein by reference in its entirety.

BACKGROUND

1. Field

Example embodiments relate to a light emitting package and a method of fabricating the same. More particularly, example embodiments relate to a light emitting package that has a structure which may prevent variance of the depth of a cavity where a chip is mounted on and a method of fabricating the same.

2. Description

A light emitting element such as a LED (Light Emitting Diode) emits light by combination of electrons and holes. Such light emitting element has small power consumption and long life span, can be installed in a limited space, and has relatively strong characteristics against vibration.

In case of a light emitting package which is comprised of one body, the depth of cavity where a chip is mounted may have significant variance in location and/or depth, depending on the concentration of etching liquid, etching time, and/or etching temperature. Due to the variance of the depth of cavity, color temperature binning may occur after spreading phosphors.

SUMMARY

According to example embodiments, a light emitting package includes a package body including a first body and a second body bonded to the first body, the first body including a cavity; a first electrode and a second electrode on the package body, the first electrode and the second electrode being separate from each other; a first dielectric layer between the package body and the first electrode and between the package body and the second electrode; and a light emitting element in the cavity and electrically connected to the first electrode and the second electrode.

According to example embodiments, the second body is doped with impurities of a first type.

According to example embodiments, the light emitting package further includes at least two impurity regions including impurities of a second type, the at least two impurity regions being in the second body and connected to the first electrode and the second electrode.

According to example embodiments, the light emitting package further includes a second dielectric layer between the first body and the second body.

According to example embodiments, at least one of the first body and the second body is pre-treated, the first body and the second body being directly bonded with each other.

According to example embodiments, wherein the at least two impurity regions and the second body include at least one zener diode.

According to example embodiments, the light emitting package further includes at least one of a phosphorescence layer and a resin layer on the light emitting element, the phosphorescence layer and resin layer filling at least a portion of the cavity.

According to example embodiments, the resin is a transparent resin and is at least one of an epoxy resin, a silicon resin, a hard silicon resin, a denatured silicon resin, a urethane resin, an oxetane resin, an acrylic resin, a polycarbonate resin, and polyimide resin.

According to example embodiments, the phosphorescence layer includes phosphors that are at least one of a nitride-based phosphors, oxynitride-based phosphors, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors, germanate phosphors, rare earth aluminate phosphors, rare earth silicate phosphors, organic phosphors and organic complex phosphors.

According to example embodiments, a method of fabricating a light emitting package includes forming a first body and a second body bonded to the first body through a dielectric layer; forming a cavity in the first body; and forming a light emitting element in the cavity.

According to example embodiments, forming the cavity includes etching the first body by using the dielectric layer as an etch mask.

According to example embodiments, the method further includes doping first impurities in the second body.

According to example embodiments, the method further includes doping second impurities in the second body to form at least two impurity regions.

According to example embodiments, the method further includes forming zener diodes including the at least two impurity regions and the second body.

According to example embodiments, the method further includes pre-treating at least one of the first body and the second body and direct bonding the first body to the second body.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
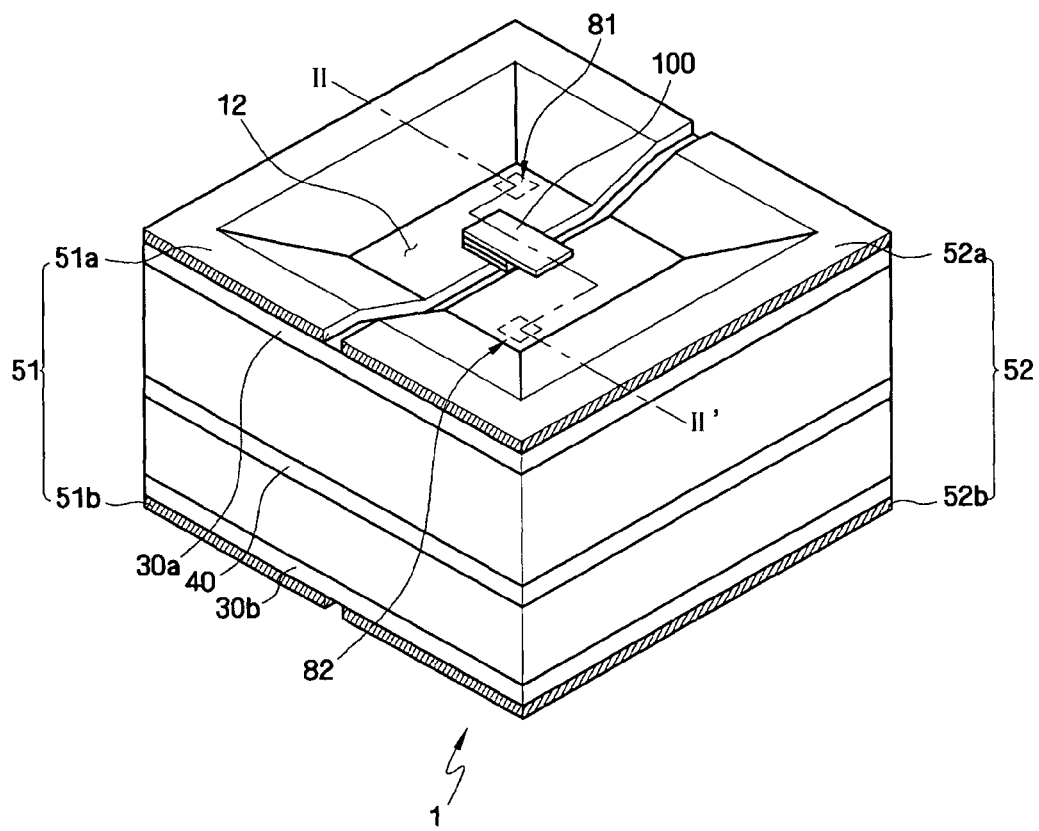
FIG. 1 is a perspective view illustrating a light emitting package according to example embodiments of inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
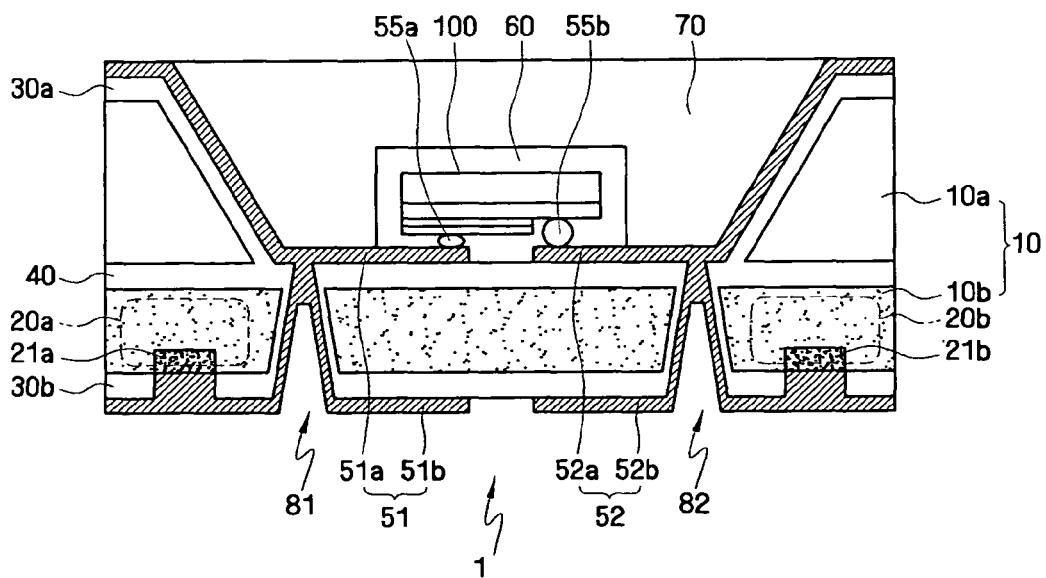
FIG. 2 is a sectional view taken along a line II-II' of FIG. 1 illustrating the light emitting package according to example embodiments of inventive concepts.
Figure 3:
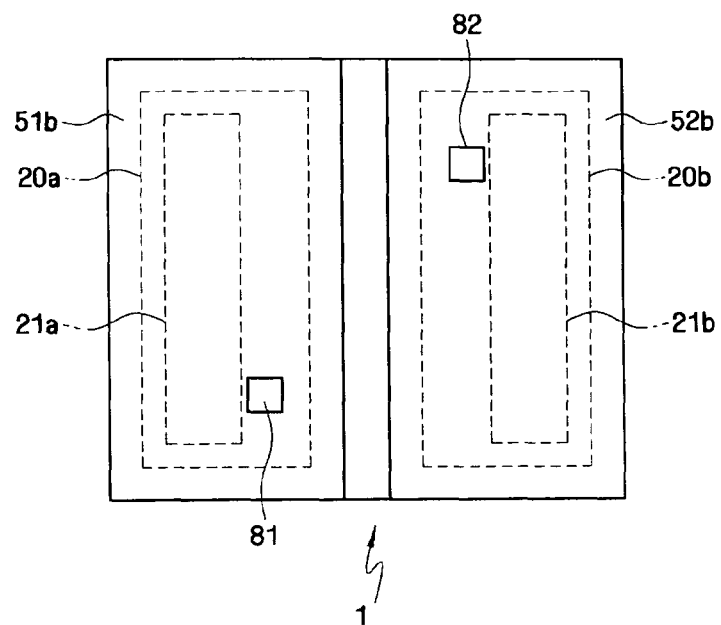
FIG. 3 is a bottom view illustrating a light emitting package of FIG. 1.

FIGS. 1 through 3 are drawings illustrating a light emitting package according to example embodiments of inventive concepts. FIG. 1 is a perspective view illustrating a light emitting package according to example embodiments of inventive concepts. FIG. 2 is a sectional view taken along a line II-II' of FIG. 1 illustrating the light emitting package according to example embodiments of inventive concepts. FIG. 3 is a bottom view illustrating a light emitting package of FIG. 1.

First, referring to FIGS. 1 and 2, a light emitting package 1 according to example embodiments of inventive concepts includes a package body 10, zener diodes 20a and 20b, a first dielectric layers 30a and 30b, a first electrode 51, a second electrode 52, a second dielectric layer 40, a phosphor 60, a resin layer 70, and a light emitting element 100.

The package body 10 includes a first body 10a and a second body 10b. The first body 10a and the second body 10b are bonded through the second dielectric layer 40.

The first body 10a, for example, can be at least one selected from a group consisting of silicon, strained silicon, silicon alloy, SOI (Silicon-On-Insulator), silicon carbide (SiC), silicon germanium (SiGe), silicon germanium carbide (SiGeC), germanium (Ge), germanium (Ge) alloy, gallium arsenide (GaAs), indium arsenide (InAs), aluminum nitride (AlN), ceramic, and polyimide series materials, or combination or stack thereof. However, it is not limited thereto. Such the first body 10a is formed with an undoped substrate, wherein the substrate is not doped with impurity.

In the first body 10a, a cavity 12 is formed. The cavity 12 penetrates the first body 10a, and the cavity 12 can be formed such that a depth of the cavity 12 is the same as a thickness of the first body 10a. The cavity 12, as illustrated in FIG. 1, can have a rectangle plane shape. However, it is not limited thereto, the plane shape can be various shapes including circle and oval shapes, for example.

The cavity 12, as illustrated in FIG. 2, has a slope toward a bottom where the light emitting element 100 is placed. On the slope the first electrode 51 and the second electrode 52 which form reflection sides are formed to reflect light generated from the light emitting element 100 and improve the light efficiency. Such cavity 12 is formed larger than the light emitting element 100, and the size of the cavity 12 can be based on the reflection level of the light generated from the light emitting element 100 by side walls of the cavity 12, a type of the resin layer 70 to fill the cavity 12, and a type of the phosphor 60. Also, it is desirable to place the light emitting element 100 in the middle of the cavity 12. If distances between the light emitting element 100 and the side walls of the cavity 12 are identical, non-uniformness of chromaticity may be prevented.

The second body 10b can be formed with substantially identical material to the first body 10a. The second body 10b is formed with a doped substrate where first impurities of a first conductive type (for example, p-type) are doped.

Impurity regions 21a and 21b, which are formed of second impurities of a second conductive type (for example, n-type) are doped in the second body 10b, and the second body 10b forms the zener diodes 20a and 20b. When an over voltage is applied to a light emitting element 100 due to static electricity, the zener diodes 20a and 20b provide a by-pass current path to prevent the light emitting element 100 from damage.

The impurity regions 21a and 21b contact with the second body 10b, and at least two can be formed. As illustrated in FIGS. 2 and 3, the second body 10b and the impurity regions 21a and 21b can form two zener diodes 20a and 20b. The two zener diodes 20a and 20b are connected in series and in reverse direction. The zener diodes 20a and 20b illustrated as dotted lines in FIGS. 2 and 3 are conceptually defined regions and a location and a shape are not limited to those illustrated in the figures.

Each of the impurity regions 21a and 21b becomes a cathode (for example, negative terminal) of each of the zener diodes 20a and 20b, and is electrically connected to the first electrode 51 and the second electrode 52, respectively. The first electrode 51 and the second electrode 52 can be overlapped with the impurity regions 21a and 21b.

The second body 10b can be an anode (for example, positive terminal) of each of the zener diode 20a and 20b.

According to example embodiments of inventive concepts, when the impurity regions 21a and 21b are formed in the doped second body 10b to form the zener diodes 20a and 20b, a doping concentration of the second body 10b and the impurity regions 21a and 21b can be controlled with relative ease. In this case, the second body 10b (and/or the first body 10a) can be formed with relatively low concentration and the impurity regions 21a and 21b can be formed with relatively high concentration. For example, the doping concentration of the second body 10b can be above about $5 \times 10^{+16}/cm^3$ and below about $1 \times 10^{+18}/cm^3$, and the doping concentration of the impurity regions 21a and 21b can be higher than that.

On both sides (for example, top and bottom) of the package body 10 the first dielectric layer 30a and 30b is formed, and the second dielectric layer 40 is formed in between the first body 10a and the second body 10b. The first dielectric layer 30a and 30b and the second dielectric layer 40 can be an oxide layer, a nitride layer, and/or an oxynitride layer. The second dielectric layer 40 is formed by a direct bonding between the dielectric layers formed on surfaces of the first body 10a and the second body 10b. It is desirable to form the second dielectric layer 40 with an oxide layer such that oxygen covalent bonding can occur during the direct bonding between the first body 10a and the second body 10b. If an oxide layer is placed between the first body 10a and the second body 10b, oxygen can be supplied continuously and as a result the bond between the first body 10a and the second body 10b can be improved. The first dielectric layers 30a and 30b and the second dielectric layer 40 can be formed on the surface of the first body 10a and the second body 10b by using a thermal oxidation method, for example.

The first dielectric layer 30a and 30b can be formed on both sides (for example, top and bottom) of the package body 10 and a hole is formed to expose the impurity regions 21a and 21b.

The first electrode 51 and the second electrode 52 are formed separate from each other on the package body 10. The first electrode 51 includes a first top electrode 51a and a first bottom electrode 51b, and the second electrode 52 includes a second top electrode 52a and a second bottom electrode 52b. Each of the first electrode 51 and the second electrode 52 is electrically connected to the light emitting element 100.

The first top electrode 51a and the second top electrode 52a are formed on the first body 10a (upper side in FIG. 2) and are separately from each other. The first top electrode 51a and the second top electrode 52a can be formed on the entire upper side of the first body 10a, or it can be formed only inside the cavity 12 if necessary.

The first electrode 51 and the second electrode 52 supply the light emitting element 100 with power, act as a heat sink that dissipates heat generated from the light emitting element 100, and provide reflective sides that reflect light generated from the light emitting element 100 efficiently.

The first top electrode 51a and the second top electrode 52a formed on the inner side of the cavity 12 and not only provide reflection sides, but also receive light generated from the light emitting element 100 directly. Heat transferred to the first top electrode 51a and the second top electrode 52a is dissipated to air, or heat can be transferred to the first bottom electrode 51b and the second bottom electrode 52b formed on the second body 10b and dissipated to the air.

In a bottom of the second body 10b a groove 81 that serves as a channel to connect the first top electrode 51a to the first bottom electrode 51b and a groove 82 that serves as a channel to connect the second top electrode 52a to the second bottom electrode 52b are formed. Such grooves 81 and 82 can be, for example, formed with a shape of inverted-V to penetrate the second body 10b from a bottom of the second body 10b.

The first bottom electrode 51b and the second bottom electrode 52b are formed on the bottom of the second body 10b separate from each other. Each of the first bottom electrode 51b and the second bottom electrode 52b are electrically connected to the impurity regions 21a and 21b through holes respectively.

Any conductive material can be used for the first electrode 51 and the second electrode 52, and it is desirable to use material with higher conduction characteristics. Although the first electrode 51 and the second electrode 52, for example, can be at least one selected from a group consisting of copper (Cu), aluminum (Al), silver (Ag), gold (Au), tungsten (W), platinum (Pt), titanium (Ti), zinc (Zn), and nickel (Ni), or combination or stack thereof, they are not limited thereto.

The light emitting element 100 placed inside the cavity 12 can be a LED (Light Emitting Diode). Although not illustrated, the light emitting element 100 includes a first conductive layer of the first conductive type (for example, p-type), a second conductive layer of the second conductive type (for example, n-type), a light emitting layer placed in between the first conductive layer and the second conductive layer, and a first chip electrode connected to the first conductive layer, and a second chip electrode connected to the second conductive layer. When a forward drive bias is applied to the light emitting element 100, carriers of the first conductive (for example, holes) and carriers of the second conductive layer (for example, electrons) are combined in the light emitting layer and light is generated. For example, the first conductive layer, the second conductive layer, and the light emitting layer can be comprised of $In_xAl_yGa_{(1-x-y)}N$ ($0 \leq x \leq 1$, $0 \leq y \leq 1$).

The light emitting element 100 can be operated by a drive bias applied across the first conductive layer and the second conductive layer. The drive bias is defined as the absolute value of difference between a first bias applied to the first conductive layer and a second bias applied to the second conductive layer. The first bias can be transferred to the first conductive layer through the first electrode 51 and a first chip electrode, and the second bias can be transferred to the second conductive layer through the second electrode 52 and a second chip electrode. Here, the drive bias can be a DC voltage; however, it is not limited thereto.

In the drawing, although the light emitting element 100 is illustrated as a flip chip type LED where two solder balls 55a and 55b are connected to the first electrode 51 and the second electrode 52, it is not limited thereto. For example, the light emitting element 100 can be a lateral type LED or a vertical type LED. In a flip chip type LED, the first chip electrode and the second chip electrode face the bottom of a package (downward direction in FIG. 1). In a lateral type LED, the first chip electrode and the second chip electrode face the top of the package (upward direction in FIG. 2). In a vertical type LED, one of the first electrode and the second electrode faces the top, and the other faces the bottom of the package.

A phosphorescence layer 60 is formed on the light emitting element 100, and a resin layer 70 can be formed on the phosphorescence layer 60 to fill the cavity 12; however, it is not limited thereto. For example, on the light emitting element 100, the resin layer can be formed to fill the cavity partially, and the phosphorescence layer can be formed on the resin layer.

Specifically, the phosphorescence layer 60 can be a mixture of transparent resin and phosphor; however, it is not limited thereto. For example, the phosphorescence layer 60 can include the phosphors without the transparent resin.

The phosphor absorbs light generated from the light emitting element 100 and transforms it into light having a different wavelength. Thus, the phosphor is material that absorbs light generated from the first light emitter and functions as a second light emitter.

By using such a phosphor, a light emitting device may display various colors. To display white color the following method may be used. When the light emitting element 100 emits blue light (light with blue wavelength) (such the light emitting element 100 is called a blue light emitting element), the phosphorescence layer 60 can include a yellow phosphor that transforms a part of the blue light and generates yellow light and a red phosphor that transforms a part of the blue light and generates red light. Also, a green phosphor that transforms a part of the blue light and generates green light and a red phosphor that transforms part of the blue light and generates red light can be included. Thus, when the light emitting element 100 is a blue light emitting device, light generated from the light emitting element 100 as the first light emitter and light generated from the phosphor as the second light emitter are mixed together and white color is displayed.

Also, when the light emitting element 100 emits light with UV wavelength (such light emitting element 100 is called a UV light emitting element), the phosphorescence layer 60 can include a red phosphor, a green phosphor, and a blue phosphors (that is, RGB).

The phosphor, for example, can be at least one selected from a group consisting of nitride/oxynitride phosphor, alkaline earth halogen apatite phosphor which is mostly activated by lanthanoid series elements including Eu and transition metal series elements including Mn, alkaline earth metal boron halogen phosphor, alkaline earth metal aluminate phosphor, alkaline earth silicate, alkaline earth sulfide, alkaline earth thiogallate, alkaline earth silicon nitride, germinate, rare earth aluminate which is mostly activated by lanthanoid series elements including Ce, rare earth silicate, and organic compound and organic complex which are mostly activated by lanthanoid series elements including Eu.; however, it is not limited thereto.

Any material that can fill the cavity 12 of the package body 10 can be used for the resin layer 70. For example, resin including epoxy resin, silicone resin, hard silicone resin, modified silicone resin, urethane resin, oxetane resin, acrylic resin, polycarbonate resin, and/or polyimide resin can be used for resin layer 70.

Figure 4:
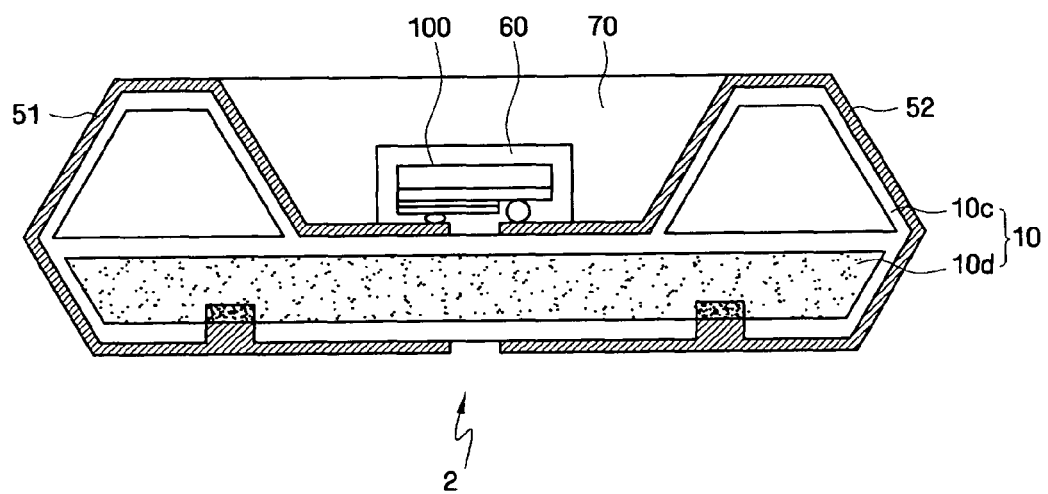
FIG. 4 is a sectional view illustrating a light emitting package according to example embodiments of inventive concepts.

FIG. 4 is a sectional view illustrating a light emitting package according to example embodiments of inventive concepts.

Referring to FIG. 4, the difference between a light emitting package 2 and the light emitting package 1 according to example embodiments of inventive concepts illustrated in FIGS. 1 and 2 is that a first electrode 51 and a second electrode 52 are formed on both sides of a package body 10 as one unit.

The first electrode 51 and the second electrode 52 are formed on a first body 10a separate from each other and extended along an outside wall of the first body 10a and the second body 10b and to a bottom of the second body 10b. Here, the first electrode 51 and the second electrode 52 are electrically connected to impurity regions 21a and 21b which are electrodes of zener diodes 20a and 20b. Other structural components are somewhat identical to the light emitting package 1 illustrated in FIG. 1.

Figure 5:
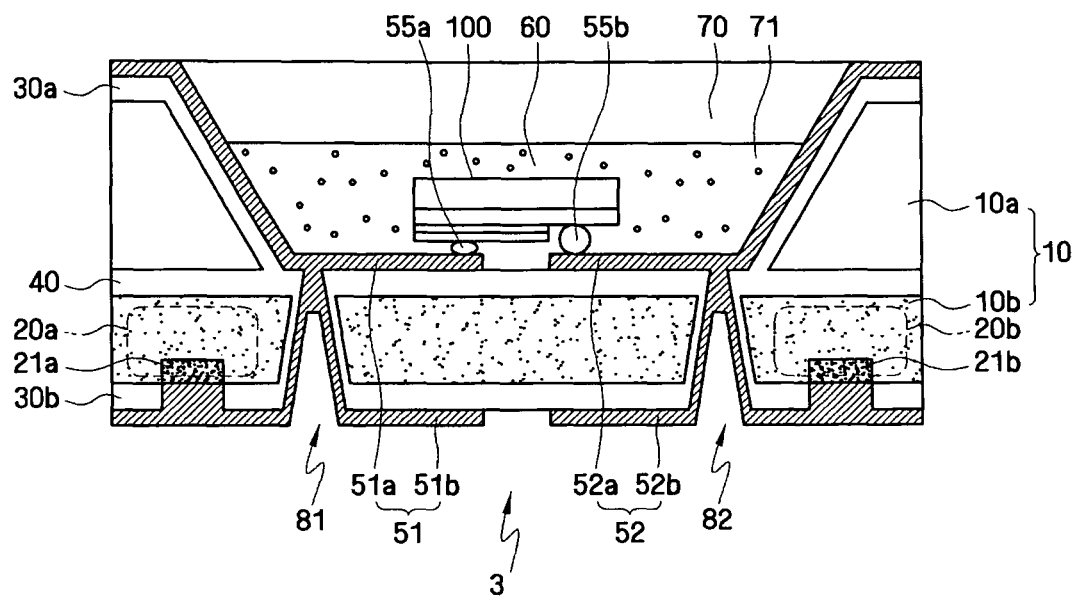
FIG. 5 is a sectional view illustrating a light emitting package according to example embodiments of inventive concepts.

FIG. 5 is a sectional view illustrating a light emitting package according to example embodiments of inventive concepts.

Referring to FIG. 5, a light emitting package 3 according to example embodiments of inventive concepts includes a first resin layer 70 and a second resin layer 71. A light emitting element 100 is mounted inside a cavity 12, and the second resin layer 71 and the first resin layer 70 are formed sequentially. Thus, light generated from the light emitting element 100 passes through the second resin layer 71 first and then passes through the first resin layer 70.

The second resin layer 71 is mixed with phosphors 60, and the phosphors 60 can be uniformly distributed in the second resin layer 71.

Figure 6:
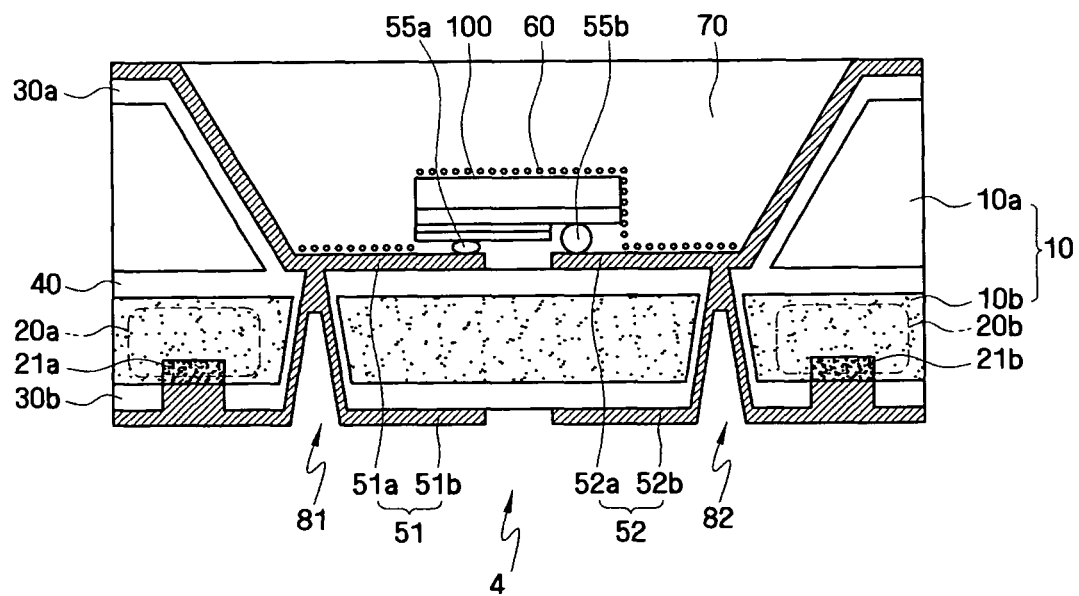
FIG. 6 is a sectional view illustrating a light emitting package according to example embodiments of inventive concepts.

FIG. 6 is a sectional view illustrating a light emitting package according to example embodiments of inventive concepts.

Referring to FIG. 6, after phosphors 60 spread over a first electrode 51, a second electrode 52, and a light emitting element 100, a resin layer 70 is filled. In this case, the phosphors 60 spread after being dissolved in a volatile material such as acetone, and then by applying heat acetone can be evaporated and removed.

Figure 7:
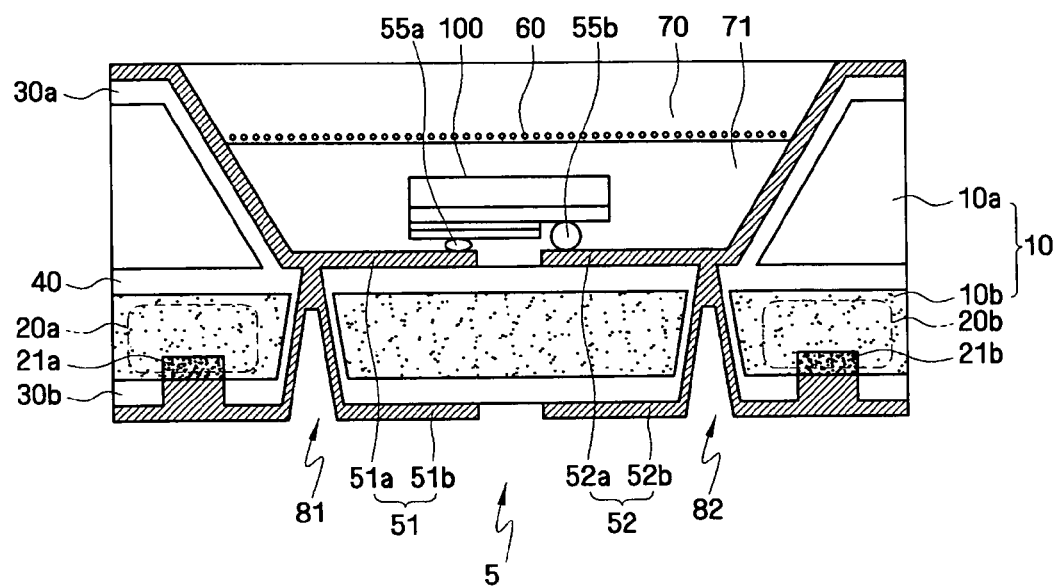
FIG. 7 is a sectional view illustrating a light emitting package according to example embodiments of inventive concepts.

FIG. 7 is a sectional view illustrating a light emitting package according to example embodiments of inventive concepts.

Referring to FIG. 7, a light emitting package 5 according to example embodiments of inventive concepts includes a first resin layer 70 and a second resin layer 71, and phosphors 60 are included in the first resin layer 70.

The phosphors 60 can be distributed close to a boundary between the first resin layer 70 and the second resin layer 71; however it is not limited thereto. The phosphors 60 can be uniformly distributed in the first resin layer 70. As illustrated in FIG. 7, the first resin layer 70 can be formed with a desired distance apart from a light emitting element 100 due to the second resin layer 71. As a result, deterioration of the phosphors 60 due to heat generated from the light emitting element 100 can be prevented.

Figure 8:
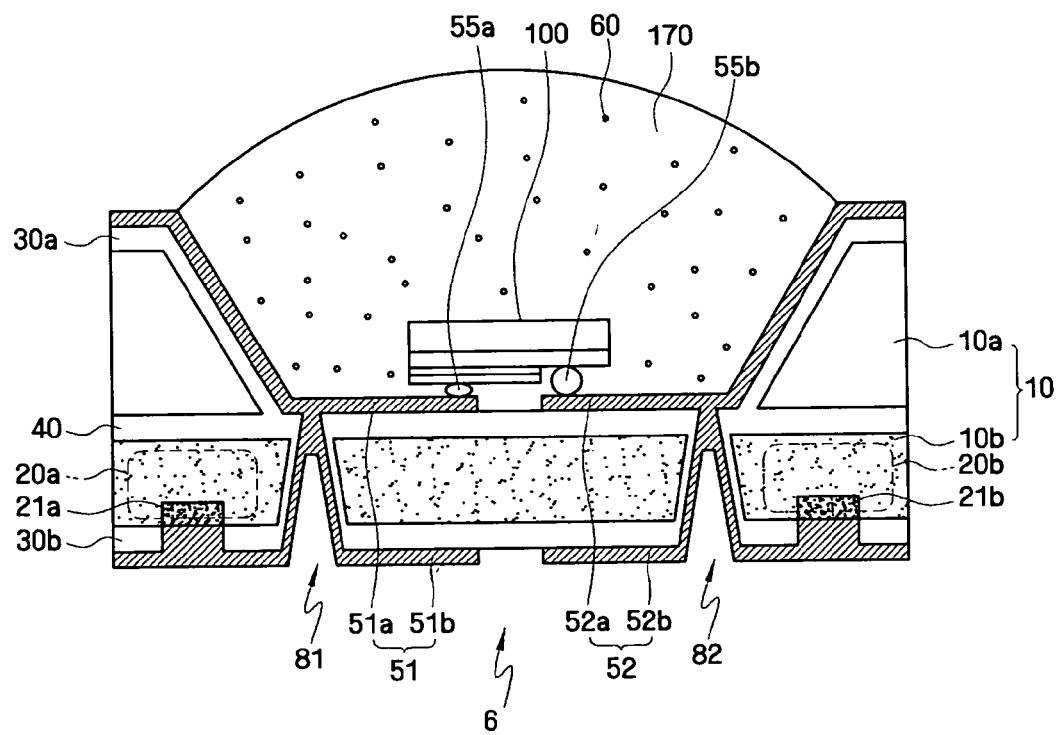
FIG. 8 is a sectional view illustrating a light emitting package according to example embodiments of inventive concepts.

FIG. 8 is a sectional view illustrating a light emitting package according to example embodiments of inventive concepts.

Referring to FIG. 8, a light emitting package 6 according to example embodiments of inventive concepts can be formed in a convex lens shape. In such resin layer 170, phosphors 60 can be mixed uniformly. Since the resin layer 170 spreads in the convex lens shape, it can have an effect where light generated from the light emitting element 100 is concentrated toward a focal point of the resin layer 170. As a result, light emitted from the light emitting element 100 can be used in an efficient manner.

Figure 9:
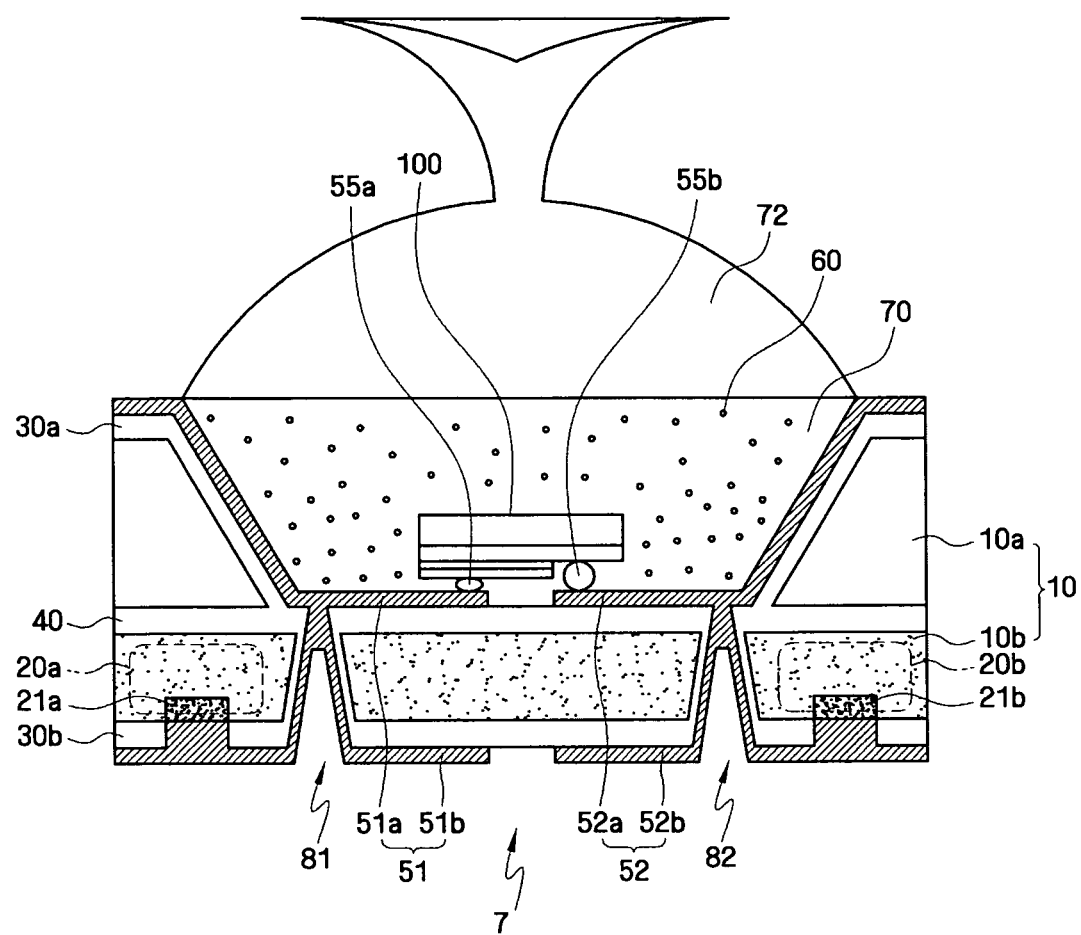
FIG. 9 is a sectional view illustrating a light emitting package according to example embodiments of inventive concepts.

FIG. 9 is a sectional view illustrating a light emitting package according to example embodiments of inventive concepts.

Referring to FIG. 9, in a light emitting package 7 according to example embodiments of inventive concepts a lens unit 72 can be formed on a resin layer 70. The lens unit 72 is formed in a concave lens shape where a center of the lens unit 72 is embodied concavely. Since the concave shape of the lens unit 72 can be embodied to function as a concave lens, one side of either an upper side or a bottom side can be formed concavely. Such lens unit 72 spreads light. Thus, a direct type back light unit of a liquid display device, the lens unit 72 can be used in a situation where light can spread in various directions to improve uniformness of light.

Referring to FIG. 9, according to example embodiments of inventive concepts, a light emitting package 7 includes a lens unit 72 formed on a resin layer 70.

Such lens unit 72 can formed with the resin layer 70 as one body, or can be attached as a separate component by using epoxy, acryl, and glass.

FIGS. 10 through 14 are drawings illustrating a light emitting system according to example embodiments of inventive concepts.

Figure 10:
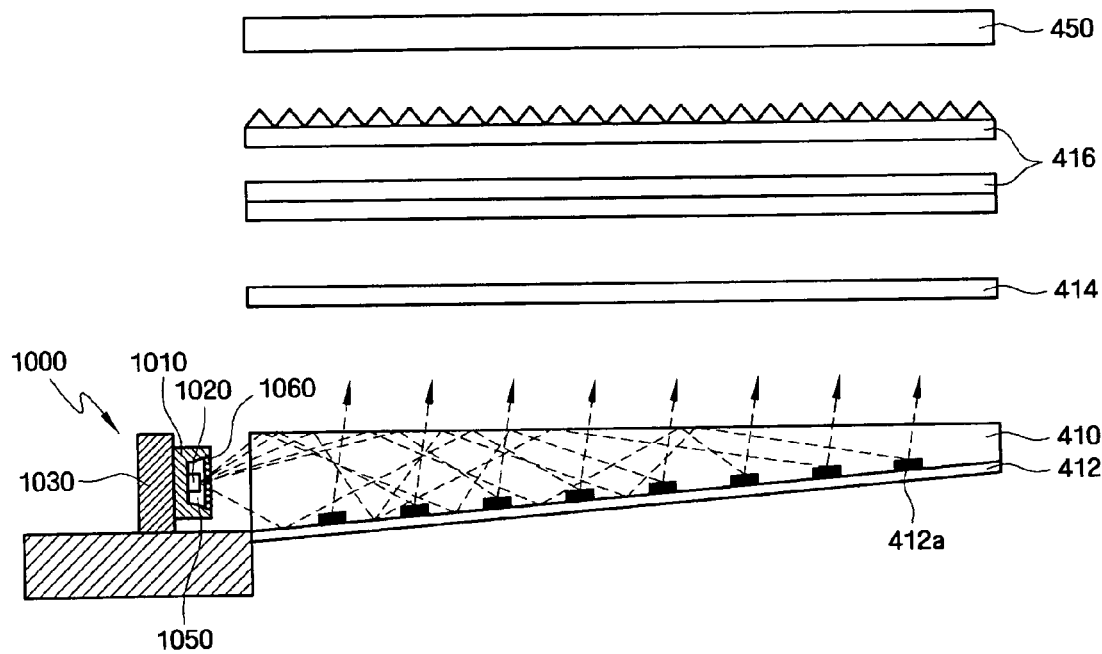
FIGS. 10 through 14 are drawings illustrating a light emitting system according to example embodiments of inventive concepts.

FIG. 10 illustrates an example system (end product) where a light emitting package 1000 according to above disclosed example embodiments of the inventive concepts. The light-emitting system of FIG. 10 may be used in various apparatuses such as lighting apparatuses, display apparatuses, and mobile apparatuses (mobile phones, MP3 players, navigations, etc.). The light-emitting system shown in FIG. 10 is an edge-type backlight unit (BLU) used in a liquid crystal display (LCD). Since LCDs do not include a light source, they use a BLU as their light source. Generally, a BLU is disposed behind a liquid crystal panel and provides light to the liquid crystal panel.

Referring to FIG. 10, the light-emitting system, (BLU) may include a light-emitting package 1000, a light guide plate 410, a reflective plate 412, a diffusion sheet 414, and a pair of prism sheets 416.

The light-emitting package 1000 may provide light and may be of a side-view type. As described previously, the light emitting package 1000 can adjust a level of drive bias and control color temperature of white light. Therefore, by controlling color temperature of the white light generated from the light emitting package 1000 used in the BLU, mood of picture displayed on a liquid crystal panel 450 can be controlled and pictures with feel of user can be created.

The light guide panel 410 guides light supplied to the liquid crystal panel 450. The light guide panel 410 is formed with transparent material such as PMMA (polymethymethacrylate) which is a type of plastic, and it moves light created from the light emitting package 1000 toward the liquid crystal panel 450 placed on the light guide panel 410. Thus, on a rear side of the light guide panel 410 various kinds of patterns 412a are printed to change a direction of light entering into the light guide panel 410 toward the liquid crystal panel 450.

The reflective plate 412 is disposed on a lower surface of the light guide plate 410 and reflects light which is transmitted thereon from the light guide plate 410. That is, the reflective plate 412 reflects light, which is not reflected by the various patterns 412a printed on the lower surface of the light guide plate 410, to an output surface of the light guide plate 410. In this manner, the reflective plate 412 may reduce loss of light and may improve the uniformity of light which is output from the output surface of the light guide plate 410.

The diffusion sheet 414 diffuses light that comes out of the light guide panel 410, thereby preventing the light from being concentrated in a specific area.

On the prism sheet 416, prisms in a triangular shape are formed in a uniform arrangement. Typically, the prism sheet 416 consists of two sheets, and the prism arrangements cross each other at a certain angle and allow light diffused by the diffusion sheet 414 to move vertically to the liquid crystal panel 450.

Figure 11:
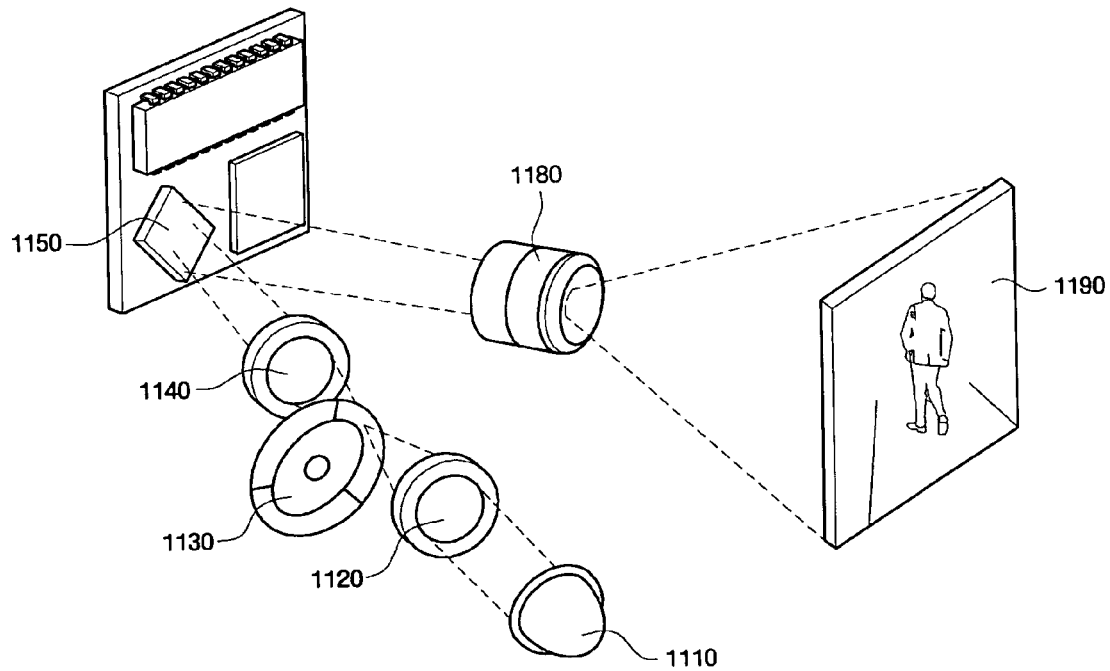
Figure 12:
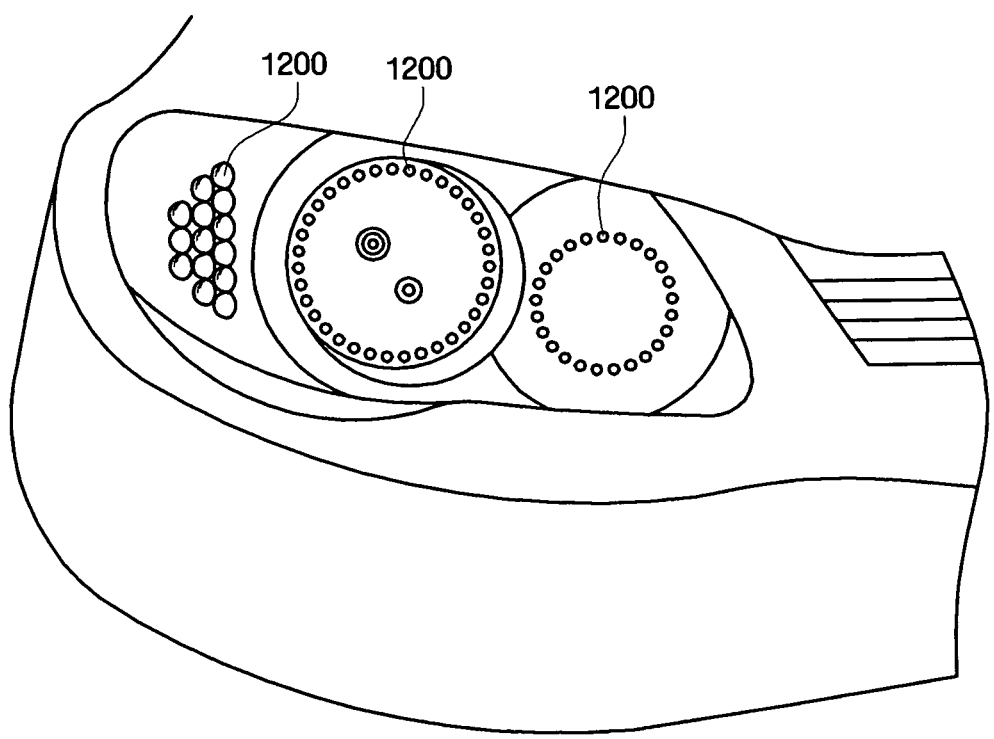
Figure 13:
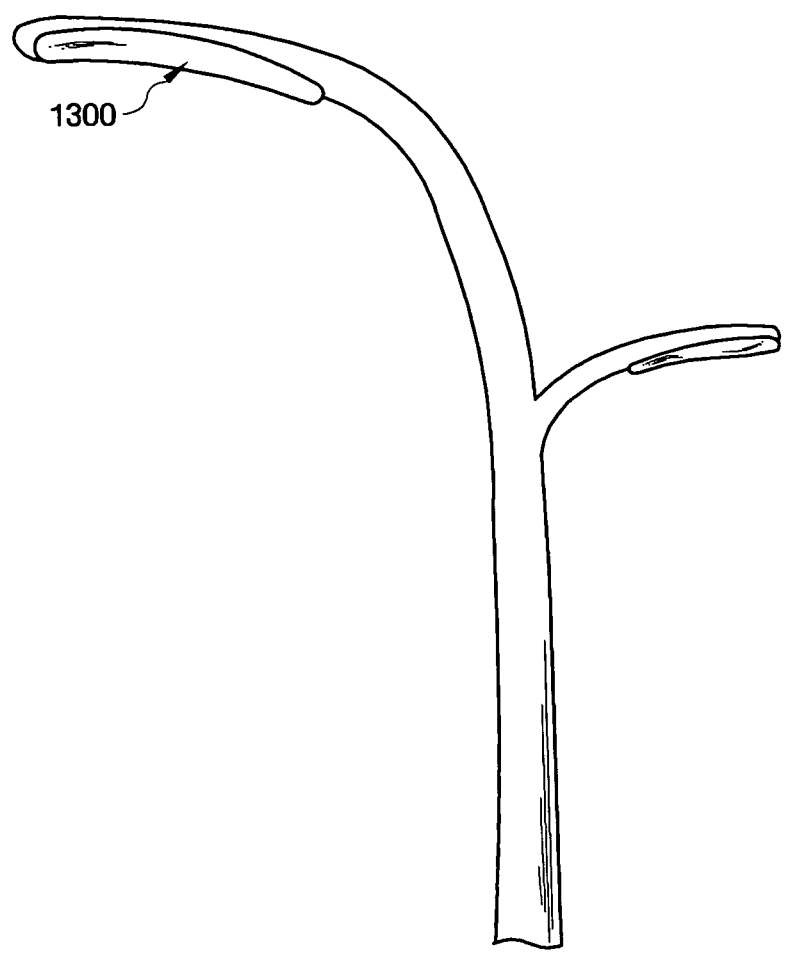
Figure 14:
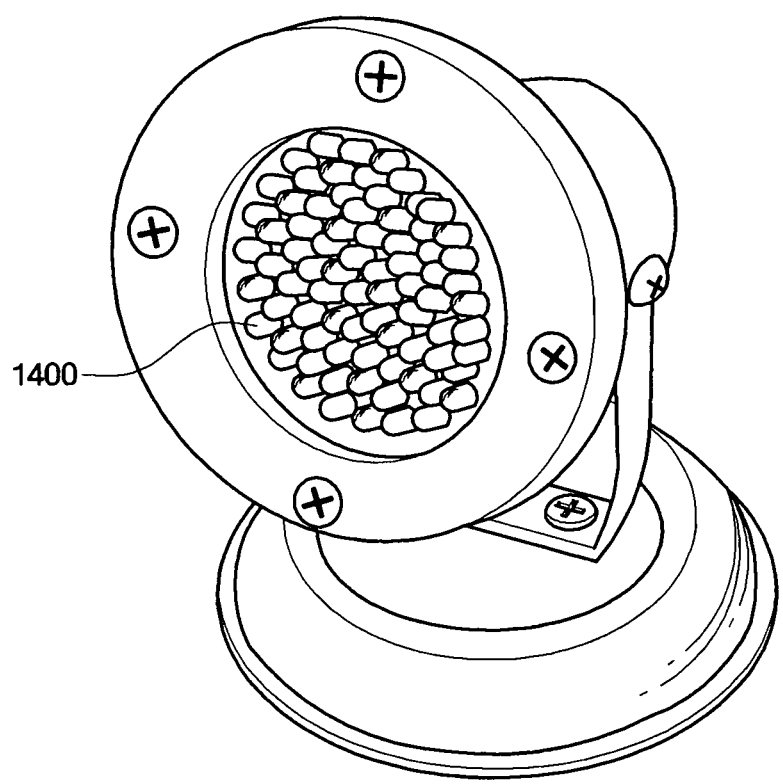

FIG. 11 illustrates a projector including the light-emitting package according to aforementioned example embodiments of the inventive concepts in the light source 1110. FIG. 12 illustrates a headlight of cars including the light emitting package 1200 according to above disclosed example embodiments of the inventive concepts. FIG. 13 illustrates a streetlight including the light emitting package 1300 according to above disclosed example embodiments of the inventive concepts, and FIG. 14 illustrates a light lamp including the light emitting package 1400 according to above disclosed example embodiments of the inventive concepts. The light emitting packages used in FIGS. 11 through 14 can be a top view type light emitting package, for example.

Referring to FIG. 11, light from a light source 1110 passes through a condensing lens 1120, a color filter 1130, and a sharping lens 1140, and is reflected by a DMD (digital micromirror device) 1150. Then it passes through a projection lens 1180 and arrives at a screen 1190. A light-emitting package according to aforementioned example embodiments of the inventive concepts may be included in the light source 1110.

Hereinafter, referring to FIGS. 15 through 24 and FIG. 2, a method of fabricating a light emitting package according to example embodiments of the inventive concepts is described. FIGS. 15 through 23 are sectional views illustrating a process intermediate steps that describe a method of fabricating a light emitting package according to example embodiments of the inventive concepts.

Figure 15:
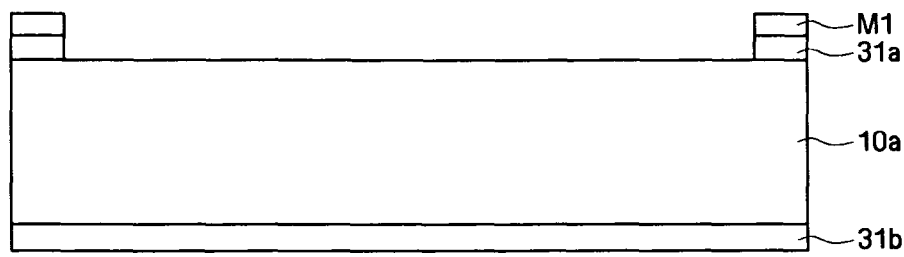
FIGS. 15 through 23 are sectional views illustrating a process intermediate steps that describe a method of fabricating a light emitting package according to example embodiments of inventive concepts.
Figure 16:
Figure 17:
Figure 18:
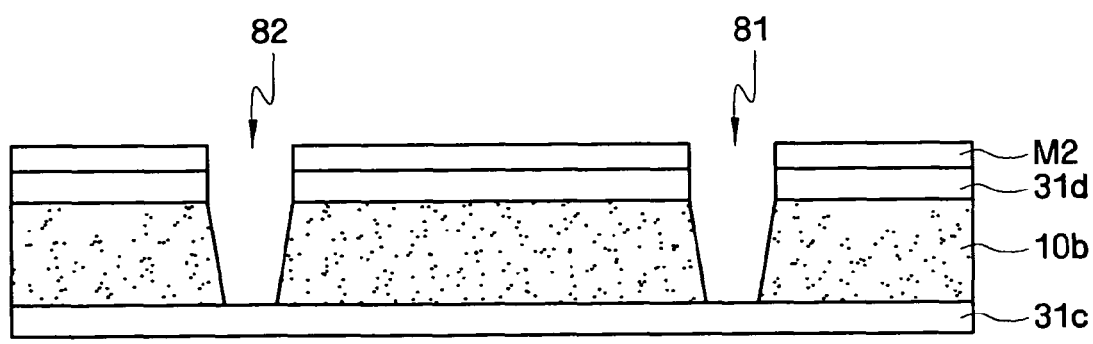
Figure 19:
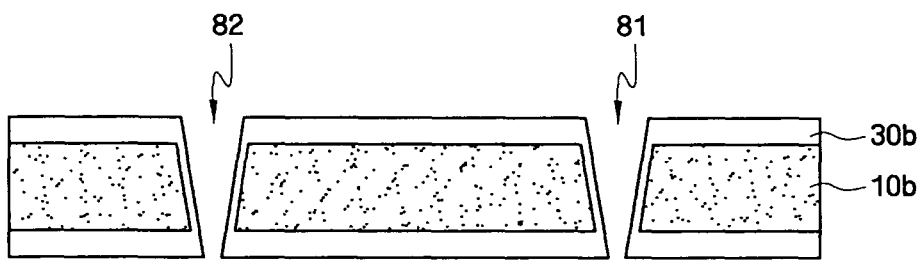

First, referring to FIGS. 15 through 17, the process of forming a first body is described and then referring to FIGS. 18 and 19 the process of forming a second body is described. To aid understanding, the fabrication process of the first body is described first; however the fabrication process of the first and the second body can be in any order or can be performed simultaneously. Also, to aid understanding it is illustrated to have a first body 10a, a second body 10b, and a package body 10 in a package unit; however a substrate where multiple first bodies 10a, second bodies 10b, and package bodies are connected continuously can be fabricated.

Referring to FIG. 15, on both sides of the first body 10a oxide layers 31a and 31b are formed. The oxide layers 31a and 31b can be composed of $SiO_2$ and formed by performing thermal oxidation. Next, a mask M1 is formed on the first body 10a (an upper side of FIG. 15), and then the oxide layer 31a is patterned Here, the mask M1 can be a photoresist pattern.

Then, referring to FIG. 16, the mask (M1 in FIG. 15) formed on the oxide layer 31a is removed, and a cavity 12 is formed on the first body 10a by using the oxide layers 31a and 31b as an etch mask. The etch process, for example, can be a wet etch process using KOH.

Next, referring to FIG. 17, the oxide layers 31a and 31b formed on both sides of the first body 10a are removed, and a first dielectric layer 30a is formed on an entire area of the first body 10a. The first dielectric layer 30a can be an oxide layer formed by using a thermal oxidation process. The first dielectric layer 30a is formed not only on an upper and a bottom sides, but also on an inside of cavity 12.

Referring to FIGS. 18 and 19, a fabrication process of the second body 10b is described.

Referring to FIG. 18, on both sides of the second body 10b, which is doped with first impurities (for example, p-type impurities), oxide layers 31c and 31d are formed. On top of the second body 10b (an upper side of FIG. 18) a mask M2 is formed. Next, by using the M2 as an etch mask grooves 81 and 82 are formed. The grooves 81 and 82 are formed in a V shape, and penetrate the second body 10b.

Next, referring to FIG. 19, the mask M2 and the oxide layers 31c and 31d formed on the second body 10b are removed, and the first dielectric layer 30b is formed on an entire area of the second body 10b. The first dielectric layer 30b is formed not only on an upper and a bottom sides of the second body 10b, but also on an inside of the grooves 81 and 82. The first dielectric layer 30b can be an oxide layer formed by using thermal oxidation process.

Figure 20:
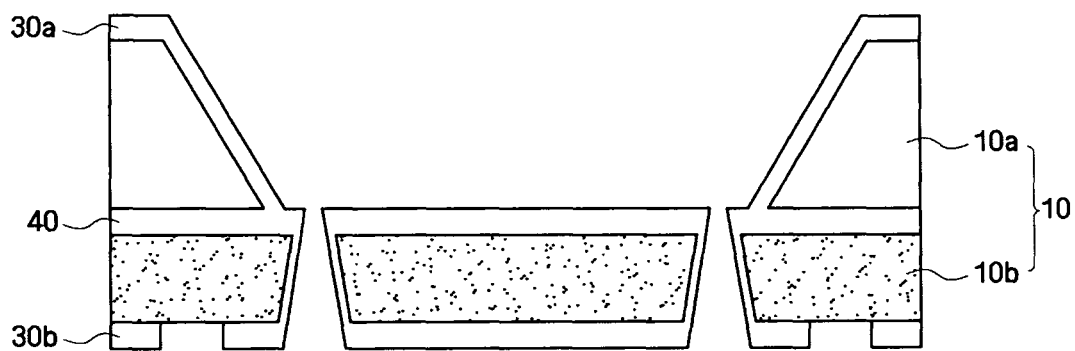

Then, referring to FIG. 20, by bonding the first body 10a in FIG. 17 to the second body 10b in FIG. 19, a package body 10 is formed. In this step, the first body 10a maintains a same direction as illustrated in FIG. 17, and the second body 10b is attached after flipping the shape illustrated in FIG. 19 180 degrees. Here, the first body 10a and the second body 10b are bonded by a direct bonding method. The first dielectric layers 30a and 30b formed on a contact side between the first body 10a and the second body 10b are bonded to form a second dielectric layer 40. The second dielectric layer 40 is a mediate layer that bonds the first body 10a to the second body 10b directly. Although the second dielectric layer 40 is substantially identical to the first dielectric layers 30a and 30b, it is defined to aid understanding.

Hereinafter, the direct bonding method is described in detail.

First, a pre-treatment is performed on at least one of the contact sides between the first body 10a and the second body 10b. The pre-treatment, for example, can be a plasma treatment. Since the plasma treatment can be performed at low temperatures, the first body 10a and the second body 10b can have less stress.

The plasma treatment, for example, can use at least one selected from a group consisting of $O_2$, $NH_3$, $SF_6$, Ar, $Cl_2$, $CHF_3$, and $H_2O$; however, it is not limited thereto.

By performing such pre-treatment, the contact side of first body 10b and the contact side of second body 10b can be activated. Thus, the contact side of the first body 10b and the contact side of the second body 10b can be transformed into a proper state for bonding.

On the contact sides of the first body 10a and the second body 10b where the pre-treatment is performed dangling bonds can be formed. Such dangling bonds can be hydrophilic dangling bonds or hydrophobic dangling bonds. Such dangling bonds formed on the contact sides of the first body 10a and the second body 10b adhere together by Van der Waals' Force, for example.

Next, a thermal treatment can be performed on the first body 10a and the second body 10b. As a result, the first body 10a and the second body 10b are connected through covalent bond.

Figure 21:
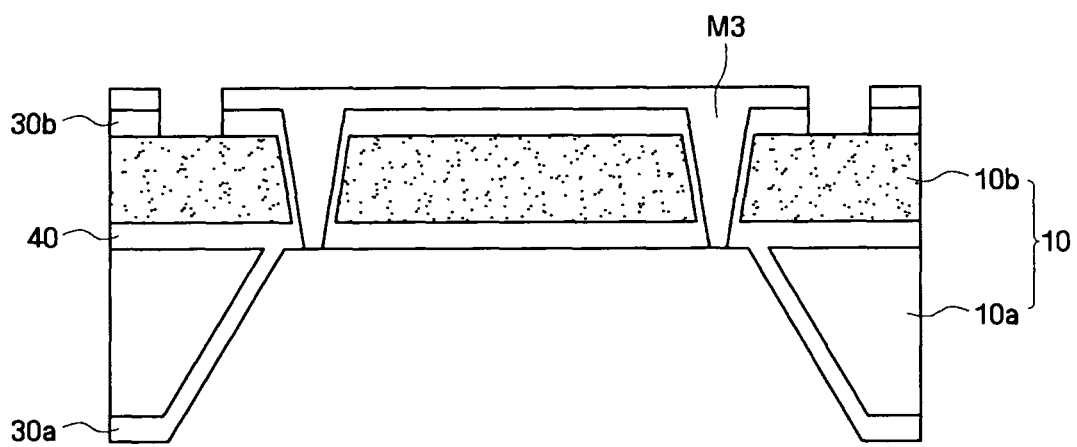

Then, referring to FIG. 21, by flipping the package body 10 by 180°, on the bottom side (an upper side of FIG. 21) of the second body 10b a mask M3 is formed. The mask M3 can be formed with photoresist, and by using the mask M3 as an etch mask, grooves are formed on the first dielectric layer 30b. The grooves, for example, can be etched by using dry etch method.

Figure 22:
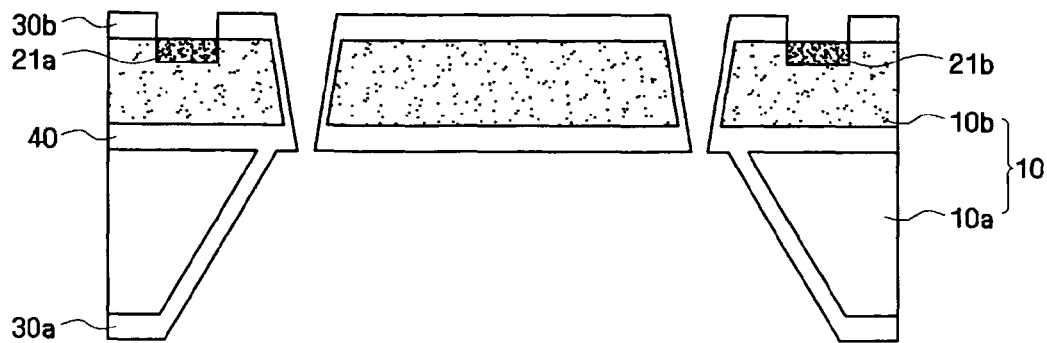

Next, referring to FIG. 22, the mask M3 in FIG. 21 is removed, and by doping second impurities (for example, n-type impurity), impurity regions 21a and 21b are formed. In this step, the impurity regions 21a and 21b, for example, can be formed by using ion implant, thermal diffusion, and/or plasma doping method.

The second body 10b and the impurity regions 21a and 21b form a pn junction and form zener diodes (refer to 20a and 20b in FIG. 2).

Figure 23:
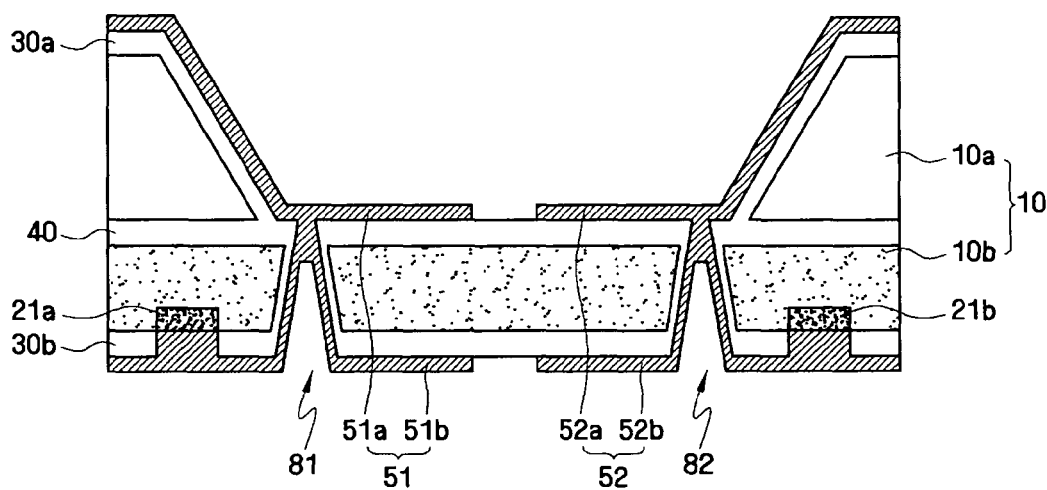

Then, referring to FIG. 23, a first electrode 51 and a second electrode 52 are formed on the package body 10 separate from each other. In this step, on the first body 10a a first upper electrode 51a and a second upper electrode 52a are formed first, and then under the second body 10b a first bottom electrode 51b and a second bottom electrode 52b are formed. As a result, the first electrode 51 and the second electrode 52 can be connected.

The first bottom electrode 51b and the second bottom electrode 52b are connected to the first upper electrode 51a and the second upper electrode 51b through the grooves 81 and 82. Here, the first bottom electrode 51b and the second bottom electrode 52b are connected to the impurity regions 21a and 21b, respectively.

The first electrode 51 and the second electrode 52 can be formed by forming a conductive material layer on the package body 10 using a sputtering method or electro-plating method and pattering.

Referring to FIG. 2, on the first upper electrode 51a and the second upper electrode 52a inside the cavity 12 a light emitting element 100 is formed. The light emitting element 100 is electrically connected to the first upper electrode 51a and the second upper electrode 52a.

Next, on the light emitting element 100 a phosphorescence layer 60 is formed.

Then, on the phosphorescence layer 60, a resin layer 70 is formed to fill the cavity 12, and the light emitting package 1 is completed.

To aid understanding, the previous descriptions of example embodiments are made based one light emitting package 1; however, the method of forming light emitting package 1, according to example embodiments disclosed above, can be used to form multiple light emitting packages on an integrated substrate. As a result, by cutting the integrated substrate into chip units, a final light emitting package can be formed.

Although, only the method of fabricating the light emitting package 1 according to example embodiments of the inventive concepts, it is obvious for those of ordinary skills in the art that the light emitting packages 2, 3, 4, 5, 6, and 7 according to example embodiments of the inventive concepts can also be fabricated from the above disclosed fabrication method.

Hereinafter, referring to FIGS. 24 through 27 a method of fabricating a light emitting package according to example embodiments of the inventive concepts is described. FIGS. 24 through 27 are sectional views illustrating a process intermediate steps that describe a method of fabricating a light emitting package according to example embodiments of the inventive concepts.

The method of fabricating the light emitting package according to example embodiments of the inventive concepts is somewhat identical to the method of fabricating the light emitting package according to example embodiments described in FIGS. 15-23, except that in the former a first body 10a is bonded to a second body 10b first, and then a cavity 12 is formed in the first body 10a.

Figure 24:
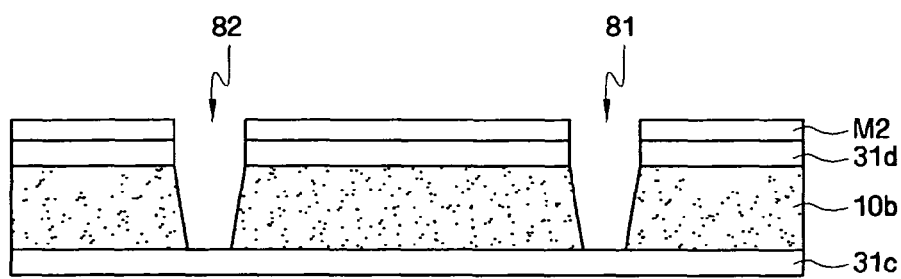
FIGS. 24 through 27 are sectional views illustrating a process intermediate steps that describe a method of fabricating a light emitting package according to example embodiments of inventive concepts.

First, referring to FIG. 24, on both sides of a second body 10b, which is doped with first impurities (for example, p-type impurities), oxide layers 31c and 31d are formed. On the oxide layer 31d on a top of the second body 10b (an upper side of FIG. 24) a mask M2 is formed. Next, by using the mask M2 as an etch mask grooves 81 and 82 are formed. The grooves 81 and 82 are formed as a V shape and penetrate the second body 10b.

Figure 25:
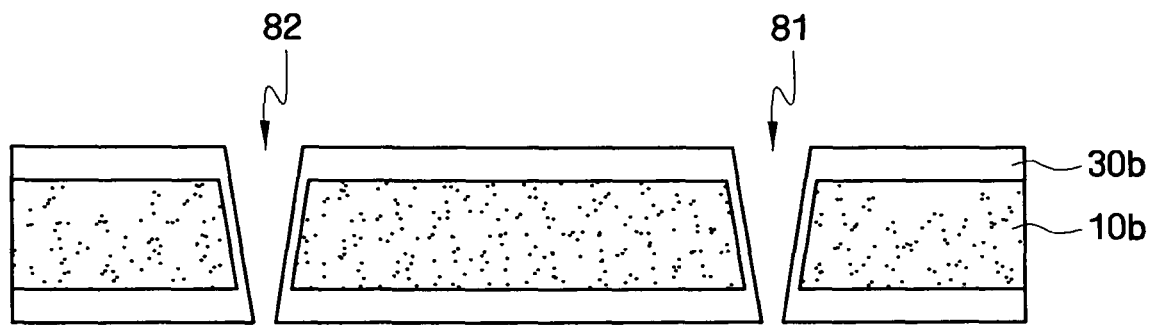

Next, referring to FIG. 25, the mask M2 and the oxide layers 31c and 31d formed on top of the second body 10b are removed, and the first dielectric layer 30b is formed on the entire area of the second body 10b. The first dielectric layer 30b is formed not only on the top and bottom sides of the second body 10b, but also on the inside of the grooves 81 and 82. The first dielectric layer 30b can be an oxide layer formed by using thermal oxidation process.

Figure 26:
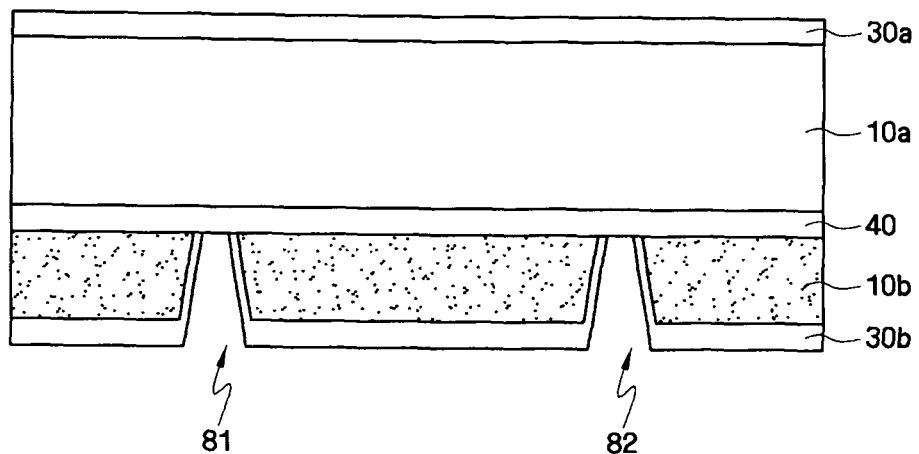

Then, referring to FIG. 26, after flipping the second body 10b in FIG. 25 180°, the first body 10a is attached to the second body 10b. Here, the first body 10a has the first dielectric layer 30a on both sides. The first dielectric layer 30a of the first body 10a can be formed with the same method as that used for the first dielectric layer 30b of the second body 10b.

As described in the example embodiments, the first body 10a can be bonded to the second body 10b by using a direct bonding method.

Figure 27:
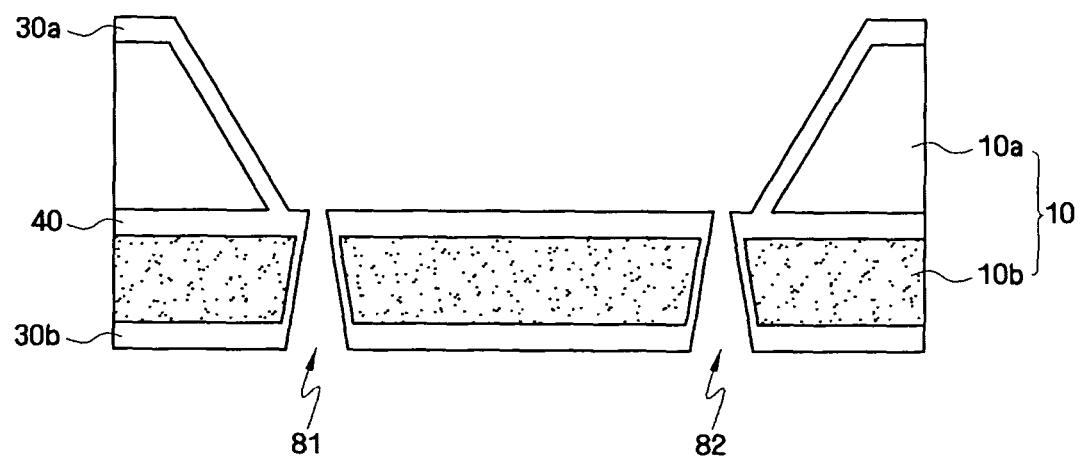

Next, referring to FIG. 27, by etching the first body 10a the cavity 12 is formed. In this step, by using the first dielectric layers 30a and 30b as etch mask the cavity 12 can be formed by performing wet etch process.

A second dielectric layer 40 placed in between the first body 10a and the second body 10b can serve as an etch stop layer during etching the cavity 12. Thus, when the first body 10a is wet-etched, the cavity 12 is formed by penetrating the first body 10a and the second dielectric layer 40 can prevent the second body 10b from etching.

Hereinafter, the fabrication process of a light emitting package is substantially identical to the process illustrated in FIGS. 21 through 23.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A light emitting package comprising:
   a package body including a first body and a second body bonded to the first body, the first body including a cavity;
   a first electrode and a second electrode on the package body, the first electrode and the second electrode being separate from each other, the first electrode and the second electrode covering an upper surface of the first body and a bottom surface of the second body;
   a first dielectric layer between the package body and the first electrode and between the package body and the second electrode;
   a light emitting element in the cavity and electrically connected to the first electrode and the second electrode, wherein the second body is doped with impurities of a first type and further includes at least two impurity regions including impurities of a second type, the at least two impurity regions connected to the first electrode and the second electrode through the first dielectric layer; and
   a second dielectric layer between the first body and the second body.

2. The light emitting package of claim 1, wherein at least one of the first body and the second body is pre-treated, the first body and the second body being directly bonded with each other.

3. The light emitting package of claim 1, wherein the at least two impurity regions and the second body include at least one zener diode.

4. The light emitting package of claim 1, further comprising at least one of a phosphorescence layer and a resin layer on the light emitting element, the phosphorescence layer and the resin layer filling at least a portion of the cavity.

5. The light emitting package of claim 4, wherein the resin is a transparent resin and is at least one of an epoxy resin, a silicon resin, a hard silicon resin, a denatured silicon resin, a urethane resin, an oxetane resin, an acrylic resin, a polycarbonate resin, and polyimide resin.

6. The light emitting package of claim 4, wherein the phosphorescence layer includes phosphors that are at least one of a nitride-based phosphors, oxynitride-based phosphors, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors, germanate phosphors, rare earth aluminate phosphors, rare earth silicate phosphors, organic phosphors and organic complex phosphors.

7. The light emitting package of claim 1, wherein at least one of the first electrode and the second electrode includes a top electrode on the first body and a bottom electrode on the second body.

8. The light emitting package of claim 1, wherein the first dielectric layer covers the upper surface of the first body between the package body and the first electrode and between the package body and the second electrode.

9. The light emitting package of claim 1, wherein the at least one of the first electrode and the second electrode is connected to the at least one of the impurity regions through a hole in the first dielectric layer.

10. The light emitting package of claim 1, wherein the second dielectric layer is physically connected to the first dielectric layer.

11. The light emitting package of claim 1, wherein the second dielectric layer is provided directly under a portion of the first electrode and a portion of the second electrode, above which the light emitting element is arranged.

* * * * *